(12) United States Patent
Morikawa et al.

(10) Patent No.: US 8,394,198 B2
(45) Date of Patent: Mar. 12, 2013

(54) SILICA GLASS CRUCIBLE FOR PULLING UP SILICON SINGLE CRYSTAL AND METHOD FOR MANUFACTURING THEREOF

(75) Inventors: Masaki Morikawa, Akita (JP); Jun Furukawa, Tokyo (JP); Satoshi Kudo, Tokyo (JP)

(73) Assignee: Japan Super Quartz Corporation, Akita-Shi (JP)

( * ) Notice: Subject to any disclaimer, the term of this patent is extended or adjusted under 35 U.S.C. 154(b) by 762 days.

(21) Appl. No.: 12/626,713

(22) Filed: Nov. 27, 2009

(65) Prior Publication Data
US 2010/0132608 A1  Jun. 3, 2010

(30) Foreign Application Priority Data
Nov. 28, 2008 (JP) ................................ 2008-305329

(51) Int. Cl.
*C30B 15/02* (2006.01)

(52) U.S. Cl. ............ 117/213; 117/214; 117/13; 117/15; 117/20

(58) Field of Classification Search .................... 117/13, 117/15, 20, 200, 213, 214
See application file for complete search history.

(56) References Cited

U.S. PATENT DOCUMENTS

| | | |
|---|---|---|
| 6,340,390 B1 | 1/2002 | Asano et al. |
| 6,548,131 B1 | 4/2003 | Fabian et al. |
| 2009/0293806 A1 | 12/2009 | Kishi |
| 2010/0006022 A1 | 1/2010 | Kishi et al. |

FOREIGN PATENT DOCUMENTS

| | | |
|---|---|---|
| JP | 1-261293 | 10/1989 |
| JP | 2-055285 | 2/1990 |
| JP | 5-009097 | 1/1993 |
| JP | 2000-169287 | 6/2000 |
| JP | 2000-327478 | 11/2000 |
| JP | 2005-272178 | 10/2005 |
| JP | 2005-320241 | 11/2005 |
| JP | 2007-210803 | 8/2007 |
| JP | 2008-162865 | 7/2008 |

*Primary Examiner* — Bob M Kunemund
(74) *Attorney, Agent, or Firm* — Greenblum & Bernstein, P.L.C.

(57) ABSTRACT

A silica glass crucible for pulling up a silicon single crystal including a wall part, a corner part and a bottom part is provided with an outer layer formed from an opaque silica glass layer which includes many bubbles, and an inner layer formed from a transparent silica glass layer which substantially does not include bubbles, wherein at least one part of an inner surface of the wall part and the corner part being an uneven surface formed with multiple damaged parts having a depth of 50 μm or more and 450 μm or less, and wherein a region among the inner surface of the bottom part within a certain range from the center of the bottom part being a smooth surface which does is substantially not formed with damage.

12 Claims, 3 Drawing Sheets

SILICA GLASS CRUCIBLE FOR PULLING UP SILICON SINGLE CRYSTAL AND METHOD FOR MANUFACTURING THEREOF

TECHNICAL FIELD

The present invention is related to a silica glass crucible used for pulling up a silicon single crystal and a method for manufacturing the silica glass crucible. In particular, the present invention is related to an inner layer structure of the silica glass crucible.

BACKGROUND OF THE INVENTION

A silica glass crucible is used in the manufacture of a silicon single crystal. In a Czochralski (CZ) method, polysilicon is charged into a silica glass crucible, heated and melted and a seed crystal is immersed in this silicon melt, and while mutually rotating the crucible and the seed crystal in opposite directions, the seed crystal is slowly pulled up and a silicon single crystal is grown. In order to manufacture a high purity silicon single crystal for use in semiconductor devices, it is necessary that the silicon single crystal not be polluted by an elution of the silica glass crucible and in addition, the silica glass crucible requires sufficient heat resistance strength.

There is natural silica and synthetic silica in the raw material of the silica glass crucible and generally natural silica has a lower level of purity than synthetic silica but has excellent heat resistance strength whereas synthetic silica has poor heat resistance strength but a high level of purity. Thus, a silica glass crucible having a two layered structure including forming an outer layer of the crucible with natural silica and increasing the strength of the crucible under a high temperature and forming an inner layer of the crucible which contacts with the silicon melt with synthetic silica and which prevents incorporating impurities, is generally used (refer to Japanese Patent Application Laid Open No. H01-261293). In addition, a crucible which has an inner layer with essentially no bubbles is also known (refer to Japanese Patent Application Laid Open No. H02-55285).

The weight of the silicon which is charged into a crucible is increasing due to the large scale of silicon ingots in recent years. As a result, it becomes more difficult to remove gas bubbles which are included within the silicon melt and these gas bubbles are incorporated into the silicon single crystal during growth causing cavity defects (also called voids or air pockets) which are formed within the crystal. Such problems have become noticeable. Argon (Ar) gas which is attached to the inner surface of the silica glass crucible, and silicon monoxide (SiO) gas which is produced by a reaction between the silica glass crucible and silicon melt are known as causes of the cavity defects. The cavity defects caused by gas bubbles largely have a spherical shape with a diameter of 300-500 μm taking up the majority of its size. However, very small cavity defects with a diameter of 150 μm or less and very large cavity defects with a diameter of 1 mm or more are also sometimes formed. In this way, cavity defects caused by gas bubbles clearly have different characteristics to Grown-in defects such as COP (Crystal Originated Particle). Presently, the presence of these defects can not be nondestructively inspected. The cavity defects can be detected only after a wafer has been cut from the ingot and appear as through holes or pinholes on the surface or interior section of the wafer.

In recent years, the effects on semiconductor devices by pinholes with a wafer are extremely large. The effects of pinholes differ depending on the size, number, position of generation and type of semiconductor device. However, in the latest semiconductor devices which have a very high integration, such effects can not be ignored and either elements can not be formed in regions which include cavity defects or even when elements can be formed their characteristics become significantly poor or unstable. In particular, because this results in many defective products and because yield of the semiconductor device decreases significantly when the number of pinholes within a wafer is large, the wafer itself has to be discarded. Therefore, it is necessary to reduce the possibility of pinholes being included within a wafer to almost zero.

In order to solves this problem, a method of adjusting a furnace pressure when melting polysilicon is proposed, for example, in Japanese Patent Application Laid Open Nos. H05-9097 and 2000-169287. In addition, a method of providing vibration to a crucible and starting growth of a silicon single crystal after reducing gas bubbles which are attached to the inner surface of the crucible is proposed in Japanese Patent Application Laid Open No. 2007-210803.

However, an environment for preventing generation of gas bubbles described above and a process for removing gas bubbles are not sufficient for manufacturing a high quality silicon single crystal without cavity defects caused by gas bubbles. Ingenuity for actively removing gas bubbles from a silicon melt is required.

SUMMARY OF THE INVENTION

The present invention solves the problems described above and the object of the present invention is to provide a silica glass crucible for pulling up a silicon single crystal which can prevent the production of cavity defects caused by gas bubbles included within the silicon single crystal. In addition, the object of the present invention is to provide a manufacturing method of a silica glass crucible which can manufacture a high quality silicon single crystal without cavity defects caused by gas bubbles.

As a result of repeated keen research which should solve the above described problem, the inventors of the present invention discovered that fine damage on the inner surface of the crucible participates in the production of SiO gas by a reaction between the silica glass crucible and silicon melt. When fine damage exists on the inner surface of the crucible, it becomes easier for SiO gas to be produced with this fine damage at the center, and when this fine damage exists at the bottom part of the inner surface of the crucible, the SiO gas produced due to the fine damage as a nucleus rises up in the silicon melt and becomes incorporated into the silicon single crystal while being pulled up. In other words, it became clear that the fine damage which exists on the inner surface of the crucible bottom part is a large cause of the production of cavity defects.

The present invention is based on this type of technical findings and the silica glass crucible according to the present invention is a silica glass crucible used for pulling up a silicon single crystal having a wall part, a corner part and a bottom part, and is arranged with an outer layer comprised from an opaque silica glass layer which includes many bubbles, and an inner layer comprised from a transparent silica glass layer which does not substantially include bubbles, wherein at least one part of an inner surface of the wall part and the corner part is an uneven surface formed with multiple damage having a depth of 50 μm or more and 450 μm or less, and a region within a fixed range from the center of the bottom part is a smooth surface in which damage is substantially not formed among the inner surfaces of the bottom part.

In addition, the silica glass crucible according to the present invention is a silica glass crucible used for pulling up a silicon single crystal having a wall part, a corner part and a bottom part, and is arranged with an outer layer comprised from an opaque silica glass layer which includes many bubbles, and an inner layer comprised from a transparent silica glass layer which does not substantially include bubbles, wherein the roughness of at least one part of an inner surface of the wall part and the corner part is rougher than an inner surface of the bottom part.

In addition, a method of manufacturing the silica glass crucible used for pulling up a silicon single crystal according to the present invention is comprised of forming a silica glass crucible by melting and vitrifying a silica powder, and forming damaged parts with a depth of 50 μm or more and 450 μm or less on at least an inner surface of a wall part and corner part of the silica glass crucible.

Because the bubbles of the SiO gas generated within the crucible rise up approximately vertically within the silicon melt, the possibility that gas bubbles generated in the inner surface of the crucible bottom part become incorporated into the silicon single crystal during the process of pulling up is high, while the possibility that the gas bubbles generated in the inner surface of the wall part become incorporated into the silicon single crystal is low. Therefore, by actively generating gas bubbles of an SiO gas from the damage formed on an inner surface of the crucible wall part and removing the SiO gas melted into the silicon melt, it is possible to create a state in which it is difficult for gas bubbles of the SiO gas to be generated from the inner surface of the crucible bottom part. That is, it is possible to solve the problem whereby the SiO gas generated at the crucible bottom part rises within the silicon melt and becomes incorporated into the silicon single crystal.

In the present invention, it is preferred that a region within a fixed range from the center of the bottom part which is a smooth surface includes at least a projection plane of the silicon single crystal. When SiO gas is generated in the region including the projection plane of the silicon single crystal, it is extremely likely that it will be included into the silicon single crystal, however, if the region which includes the projection plane of the silicon single crystal is formed by a smooth surface, it is possible to prevent with certainty the generation of gas bubbles which might be incorporated into the silicon single crystal. In particular, it is preferred that a region within 50% of the diameter of the crucible from the center of the crucible bottom part be included. If the above stated conditions are fulfilled regarding the formed region of the smooth service with respect to the crucible diameter, it is possible to prevent with certainty the generation of gas bubbles which might be incorporated into the silicon single crystal.

In the present invention, it is preferred that the number of damaged parts formed on an inner surface of the corner part be more than the number of damaged parts formed on an inner surface of the wall part. In this way, it is possible to serve the damaged parts as a source for generating gas bubbles from an early stage in the raw material melting process and by positioning as far as possible from the silicon single crystal (seed crystal) it is possible to reduce obstacles to crystallization.

In this way, the present invention can provide a silica glass crucible which can prevent the generation of cavity defects caused by incorporation of gas bubbles of SiO gas within the silicon single crystal and manufacture a high quality silicon single crystal.

In addition, the present invention can provide a manufacturing method of a silica glass crucible which can manufacture a high quality silicon single crystal with no cavity defects caused by gas bubbles.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENT

Preferred embodiments of the present invention will now be described in detail hereinafter with reference to the accompanying drawings.

Figure 1:
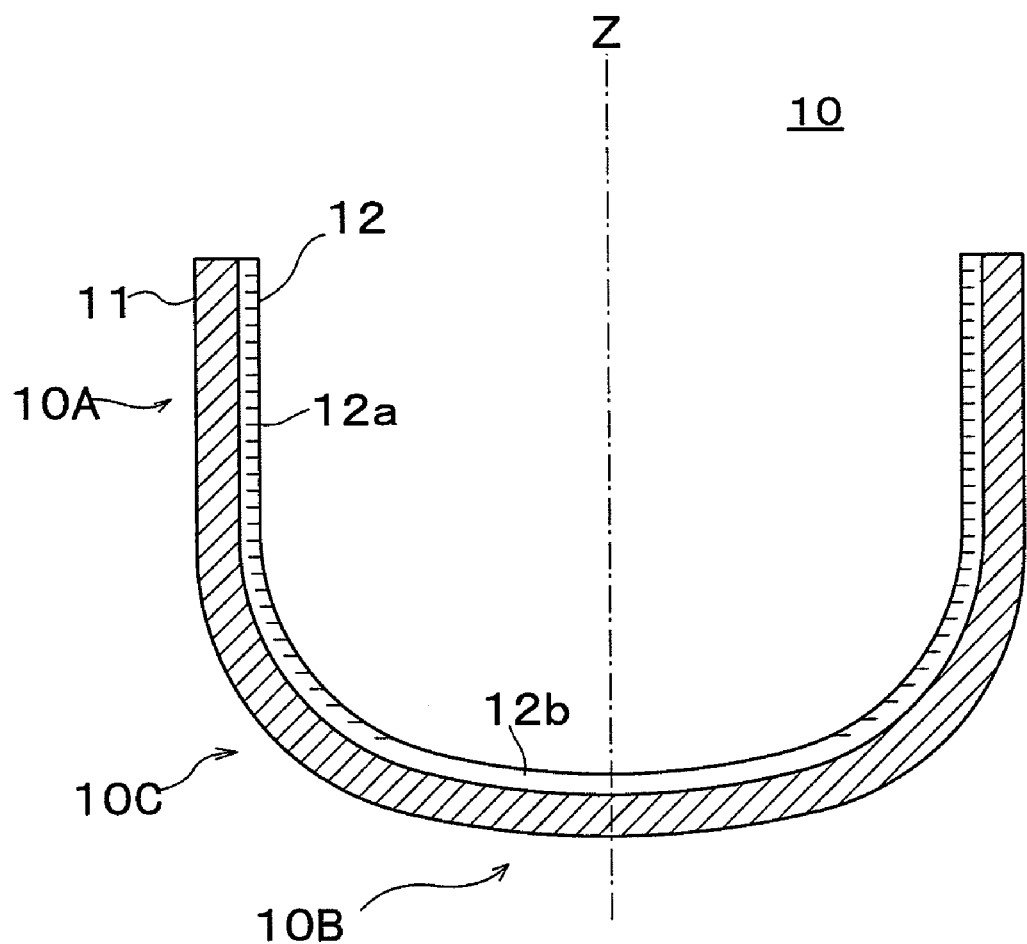
FIG. 1 is a schematic cross sectional view which shows a structure of a silica glass crucible for pulling up a silicon single crystal according to a preferred embodiment of the present invention.

FIG. 1 is a schematic cross sectional view which shows a structure of a silica glass crucible for pulling up a silicon single crystal according to a preferred embodiment of the present invention.

As is shown in FIG. 1, the silica glass crucible 10 has a two-layer structure including an opaque silica glass layer 11 which forms an outer layer, and a transparent silica glass layer 12 which forms an inner layer.

The opaque silica glass layer 11 is an amorphous silica glass layer which includes many microscopic bubbles, and is arranged over the entire crucible from the wall part 10A to the bottom part 10B. Because the opaque silica glass layer 11 has higher heat resistance strength compared to the transparent silica glass layer 12, it is possible to increase the heat resistance strength of the entire crucible. It is preferred to use natural silica as the raw material of the opaque silica glass layer 11. Because natural silica has a higher viscosity at high temperatures compared to synthetic silica, it is possible to increase the heat resistance strength of the entire crucible. In addition, natural silica is cheaper than synthetic silica making it advantageous in terms of costs. The bubble containing ratio of the opaque silica glass layer 11 is preferred to be 0.7-2% and the average diameter of the bubbles is preferred to be around 100 μm. Here, the bubble containing ratio is defined as the ratio ($W_2/W_1$) of a bubble occupied volume ($W_2$) per unit volume ($W_1$).

The transparent silica glass layer 12 is an amorphous silica glass layer which essentially does not include bubbles, and is arranged over the entire crucible from the wall part 10A to the bottom part 10B. It is possible to prevent an increase in silica fragments which peel off from the inner surface of the crucible, and increase the silicon single crystal yield by the transparent silica glass layer 12. It is preferred to use synthetic silica as the raw material of the transparent silica glass layer 12. It is possible to prevent the elution of impurities into a silicon melt in the case where synthetic silica is used in the inner layer of the crucible and increase the silicon single crystal yield. Here, "essentially does not include bubbles"

means that the bubble containing ratio is 0.1% or less and the average diameter of the gas bubbles is 100 μm or less.

It is preferred that the thickness of the crucible be 8-30 mm and the thickness of the transparent silica glass layer 12 be 0.5 mm or more and 1.5 mm or less. This is because when the transparent layer is thinner than 0.5 mm, the transparent silica glass layer 12 is completely dissolved when pulling up the crystal and the opaque silica glass layer 11 may be exposed, and when the transparent silica glass layer is thicker than 1.5 mm, the effects of preventing indents or scratches in the crucible inner surface can not be obtained. Furthermore, the thickness of the transparent silica glass layer 12 may be uniform, may be formed so that it gradually becomes thicker heading towards the outer side (corner part 10C) from the center of the bottom part 10B, and also may be formed so that it gradually becomes thicker heading towards the corner part 10C from the wall part 10A.

The wall part 10A of the crucible is a cylindrical part which is parallel to the center axis (Z axis) of the crucible and extends approximately directly down from the opening of the crucible. However, the wall part 10A does not have to be completely parallel with respect to the Z axis and may incline so that it gradually widens towards to the opening. In addition, the wall part 10A may be a straight line or may curve smoothly.

The bottom part 10B of the crucible is the roughly disk shaped part which includes the intersection point with the crucible Z axis and the corner part 10C is formed between the bottom part 10B and the wall part 10A. The shape of the bottom part 10B may be a round bottom or a flat bottom. In addition, it is possible to arbitrarily set the curvature and angle of the corner part 10C. When the crucible bottom part 10B is a round bottom, because the bottom part 10B has adequate curvature, the difference in curvature between the bottom part 10B and the corner part 10C is much smaller than a flat bottom. In the case where the bottom part 10B is a flat bottom, the bottom part 10B has an even or extremely moderate curved surface and the curvature of the corner part 10C is very large. Furthermore, the bottom part 10B can be defined as a region in which the tangent angle of inclination of a crucible wall surface with respect to a flat surface XY which intersects the Z axis is 30° or less.

Multiple fine damage is formed on the inner surface of the crucible wall part 10A and corner part 10C forming an uneven surface 12a. This damage plays the role of precipitating SiO which is dissolved in the silicon melt. Because the bubbles of the SiO gas generated on the uneven surface 12a rise in an almost vertical direction within the silicon melt, they are discharged into a furnace space without being incorporated into the silicon single crystal while being pulled up. Therefore, it is possible to actively remove the SiO gas bubbles even during the pulling up process of the silicon single crystal.

The amount of damaged parts is preferred to be around 100-500. This is because when the amount of damage is too small sufficient effects can not be obtained and when the amount of damage is large the silicon single crystal yield decreases. In particular, if the fact that the maximum amount of cavity defects which are generated in a silicon single crystal ingot is around 400 is considered, a suitable amount of the damaged parts in the crucible is 100-500. Further, the depth of the damaged parts is preferred to be around 50-450 um. This is because when the depth of damage is too shallow sufficient effects can not be obtained and when the depth of damage is large the silicon single crystal yield decreases. In particular, if the fact that the average diameter of cavity defects which are generated in a silicon single crystal is around 400 um is considered, a suitable size of the damaged part which precipitates bubbles which become the cause for cavity defects having this size is 50-450 um. The shape of the damaged part is not particularly limited. The damage may be dimple shaped or a scratch having a long thin line shape.

The formation position of a damaged part is preferred to be as much as possible at the lower part of the crucible excluding a bottom part region in which bubbles are not supposed to be generated. It is preferred that source of the bubbles function as much as possible from an early stage of the raw material melt process. In addition, by positioning the source of the bubbles as far away as possible from the silicon single crystal (seed crystal) it is possible to control (reduce) obstacles to crystallization. In order to achieve this it is preferred that damage be formed on an inner surface of the corner part 10C as well as the crucible wall part 10B, and the number of damaged parts formed on the inner surface of the corner part 10C is preferred to be more than the number of damaged parts formed on the inner surface of the wall part 10A. The SiO gas bubbles which are generated on the inner surface of the corner part 10C also rise in the silicon melt and are discharged into the furnace space without being incorporated into the silicon single crystal during the pulling up process, the same as in the case of the crucible wall part 10B. Furthermore, it is not necessary for the fine damage in the crucible inner surface to be formed on the entire inner surface of the crucible wall part 10A. The fine damage may also be formed on a region in one part of the inner surface of the crucible wall party 10A. In addition, it is sufficient if the fine damage is formed in a region which contacts with the silicon melt and it is possible to omit forming damage near the top end of the wall part 10A which does not contact with the silicon melt.

Fine damage is not formed on the inner surface of the crucible bottom part 10B and the smooth surface 12b is formed. In other words, the inner surface of the crucible bottom part 10B is less rough then inner surface of the crucible wall part 10A. As a result, bubbles are almost never generated from the inner surface of the crucible bottom part 10B. It is not necessary to arrange the smooth surface 12b on the entire inner surface of the crucible bottom part 10B and may be within a certain range from the center of the crucible bottom part 10B. In the case, where SiO gas bubbles are generated on the crucible bottom part 10B, the SiO gas rises within the silicon melt and may be incorporated into the silicon single crystal during the pulling up process. However, because most of the SiO which melts into the silicon melt forms bubbles as the source of damage formed on the crucible wall part 10A, it is possible to prevent the generation of SiO gas on the crucible bottom part 10B.

Figure 2:
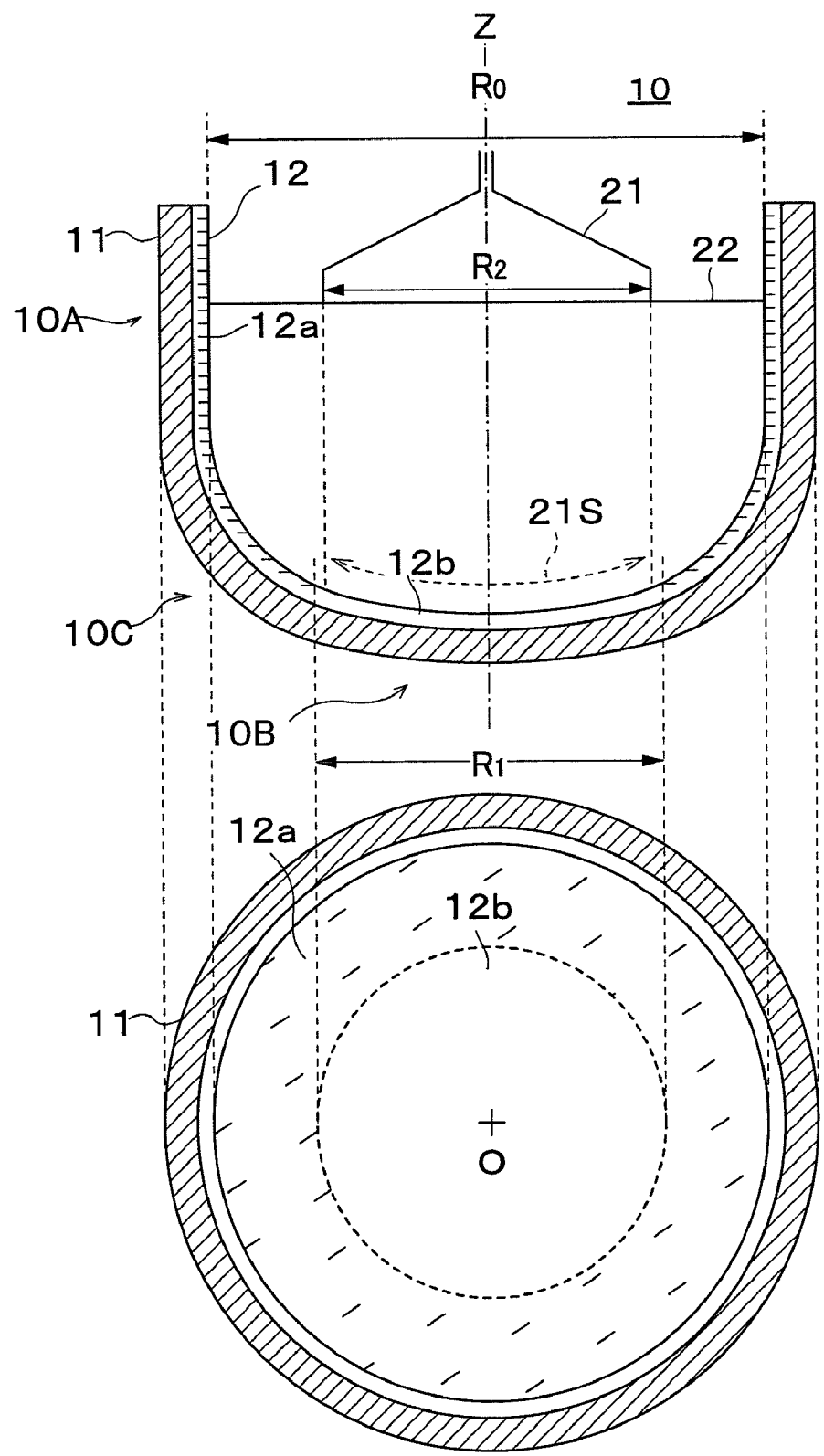
FIG. 2 is a cross sectional and planar view diagram which shows a positional relationship between the silica glass crucible and a silicon single crystal.

FIG. 2 is a cross sectional and planar view diagram which shows a positional relationship between the silica glass crucible and a silicon single crystal.

The shape of the smooth surface 12b formed on an inner surface of the crucible bottom part 10B seen from the Z axis direction is a round shape with an intersection point O with the Z axis at the center, and its diameter $R_1$ is more preferably equal to or more than a diameter $R_2$ of the silicon single crystal 21 which is pulled up. In other words, it is preferred that the smooth surface 12b covers the projection plane of 21 of the silicon single crystal 21. Furthermore, the diameter $R_2$ of the silicon single crystal 21 is a few mm to tens of mm larger than the diameter of the final silicon wafer product.

The diameter $R_2$ of the silicon single crystal 21 is not principally determined by the shape or size of the silica glass crucible 10. However, it is significantly dependent on the diameter $R_0$ of the silica glass crucible 10. If the crucible diameter $R_0$ is too small with respect to the silicon single crystal diameter $R_2$, crystal quality control such as oxygen concentration and oxygen in-plane distribution of the single crystal becomes difficult, and if it is too large, manufacturing costs increase with a necessity of the large size of devices and components. Considering these points, the diameter $R_2$ of the silicon single crystal 21 is preferably set at $0.3R_0$-$0.6R_0$ with respect to the diameter $R_0$ of the silica glass crucible 10, and it preferred that the diameter $R_1$ of the formation region of the smooth surface 12$b$ be equal to or more than $0.5R_0$. That is, the formation region of the smooth surface 12$b$ is preferred to include a region within 50% of the crucible diameter from the center of the crucible bottom part 10B. This is because when the diameter $R_1$ of the formation region of the smooth surface 12$b$ is smaller than $0.5R_0$, the projection plane 21S of the silicon single crystal 21 can not be covered and the possibility that the bubbles of the SiO gas which is produced from the crucible bottom part 10B are incorporated into the silicon single crystal 21 increases.

Next, the diameter $R_1$ of the formation region of the smooth surface 12$b$ will be explained in detail. For example, in the case of pulling up a roughly 300 mm diameter silicon single crystal using a 32 inch (diameter $R_0$=800 mm) silica glass crucible, the minimum diameter $R_1$ of a formation region of the smooth surface 12$b$ becomes $0.5R_0$=400 mm. If the diameter $R_1$ of the formation region of the smooth surface 12$b$ is equal to or more than 400 mm there is almost no decrease in the single crystal yield and it is possible to effectively control the generation of gas bubbles which may be incorporated into the silicon single crystal during the pulled up process.

As explained above, the gas bubbles of the Ar or SiO rise almost perpendicularly, and the gas bubbles which are generated further to the exterior (exterior to the smooth surface 12$b$) of the projection plane 21S of the silicon single crystal 21 during the process of being pulled up, for some reason, rise while shifting slightly in a horizontal direction, and as a result may be incorporated into the silicon single crystal 21. However, the position of such gas bubbles is in the vicinity of the periphery of the silicon single crystal 21 and because the vicinity of the periphery of the silicon single crystal is later ground as an unnecessary part. It is therefore no problem even if the gas bubbles are incorporated in the silicon single crystal 21.

As explained above, in the silica glass crucible 10 of the present embodiment, because an uneven surface having multiple fine damage is formed on an inner surface of the crucible wall part and corner part, and a smooth surface with essentially no damage is formed on an inner surface of the crucible bottom part, it is possible to generate SiO gas from the crucible wall part 10A during the pulling up process of the silicon single crystal and actively remove the SiO which is melted into the silicon melt. Therefore, it is possible to control the generation of SiO gas from the crucible bottom part 10B and prevent the generation of cavity defects within the silicon single crystal.

Figure 3:
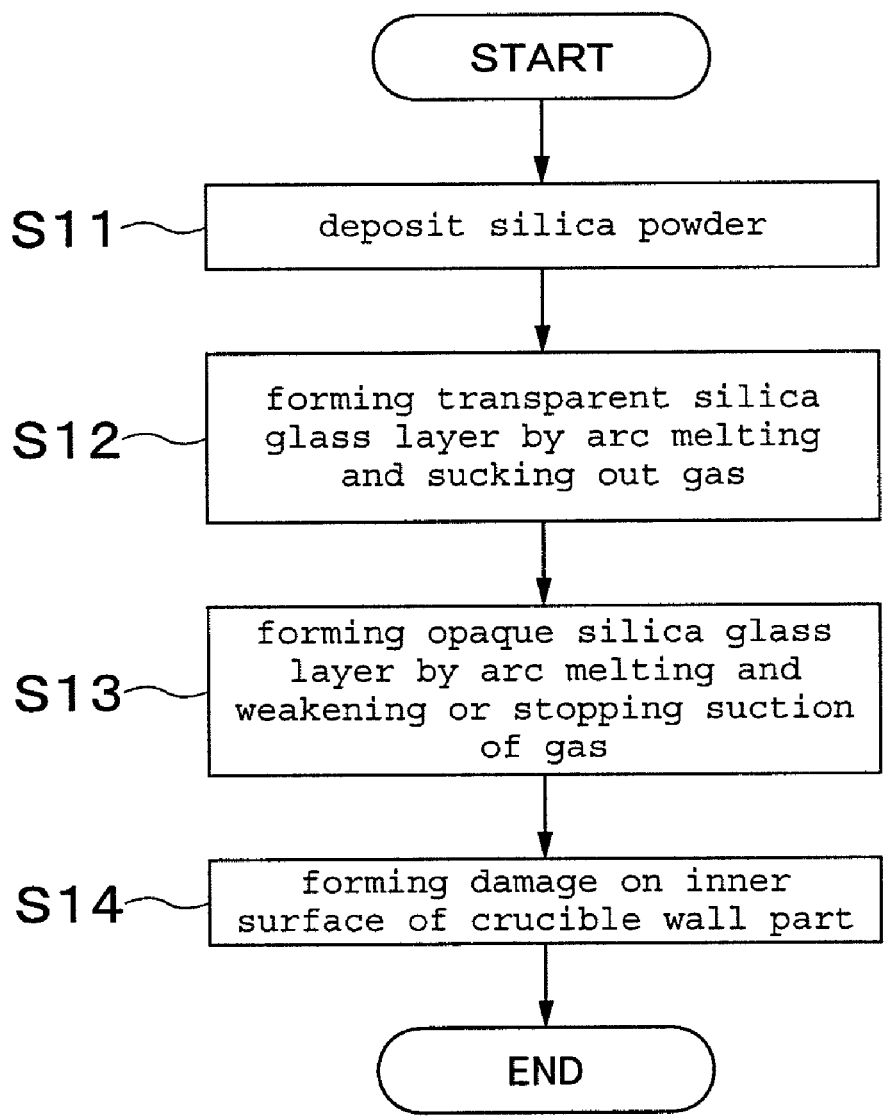
FIG. 3 is a flowchart which shows a manufacturing method of a silica glass crucible for pulling up a silicon single crystal by the preferred embodiment of the present invention.

Next, a manufacturing method of the silica glass crucible 10 will be explained while referring to the flow chart in FIG. 3.

The silica glass crucible 10 can be manufactured by a rotating mold method. In the rotating mold method, natural silica powder is deposited to a certain thickness on an inner surface of a rotating carbon mold (step S11). Then, an arc discharge from the interior of the mold is performed, the entire inner surface of the silica powder is heated to 1720° C. or more and the silica powder is melted. In addition, at the same time as this heating, pressure decreases from the mold side, gas within the melt silica is sucked to the outer layer side via a vent arranged in the mold, and by discharging the gas to the outside via the vent the gas bubbles of the crucible inner surface are partially removed and an inner layer comprised of the transparent silica glass layer 12 is formed with essentially no bubbles (step S12). Following this, the pressure is weakened or stopped for forcing the bubbles to remain while continuing heating, whereby an opaque silica glass layer 11 including a lot of micro bubbles is formed (step S13).

Following this, by attaching damage to the inner surface of the crucible wall part 10A and the crucible corner part 10C using a diamond pen, multiple fine damage is formed (step S14). Instead of a diamond pen, it is possible to use various tools which can form damage on the inner surface of the crucible, and by adjusting the size, shape and position of the silicon which is deposited into the crucible, it is possible to control the shape of the damage. By the above, the silica glass crucible 10 of the present embodiment is completed.

The present invention has thus been shown and described with reference to specific embodiments. However, it should be noted that the present invention is in no way limited to the details of the described arrangements but changes and modifications may be made without departing from the scope of the appended claims.

EXAMPLES

Example 1

Samples A1-A5 of a silica glass crucible having the structure shown in FIG. 1 were prepared. Each sample A1-A5 had a diameter of 32 inches (diameter 800 mm), crucible height of 500 mm, and wall part thickness of 17 mm, corner part thickness of 25 mm and bottom part thickness of 14 mm from the inner surface to the exterior surface of the crucible. In addition, the thickness of the wall part transparent silica glass layer was 1.0 mm. Furthermore, damage of a certain depth was formed on the inner surface of the crucible wall part, corner part and bottom part respectively. As will be described below, the number and depth of the damaged parts was different for each sample.

Next, after charging 400 kg of polysilicon chunks into each of the samples A1-A5 of these silica glass crucibles, the silica glass crucibles were loaded into a single crystal pulling device, the polysilicon within the crucible was melted in a chamber and a silicon single crystal ingot with a diameter of around 300 mm was pulled up.

Following this, wafers of approximately 1 mm thickness were cut from the silicon single crystal ingot that was pulled up using a wire saw and a polished wafer with a mirror polished surface was created using a CMP process. Then, the generation percentage of pinholes in this polished wafer was measured. A particle measurement device was used to measure the pinhole generation percentage and the number of pinholes in the surface of the polished wafer was measured. The pinhole generation percentage is a figure in which the total number of pinholes included within multiple wafers obtained from one silicon single crystal divided by the number of wafers. In addition, the single crystal yield (relative value) of the silicon single crystal ingot which was obtained was also measured. The results are shown in Chart 1.

CHART 1

| CRUCIBLE SAMPLE | DAMAGE DEPTH | NUMBER OF DAMAGED PARTS | | | SINGLE CRYSTAL YIELD (RELATIVE VALUE) | PINHOLE (PH) | | |
|---|---|---|---|---|---|---|---|---|
| | | WALL PART | CORNER PART | BOTTOM PART | | PH MEASURED NUMBER | PH GENERATED NUMBER | PH GENERATED RATE |
| A1 | 50~450 μm | 50 | 200 | 0 | 1 | 5,044 | 2 | 0.04% |
| A2 | ~50 μm | 50 | 200 | 0 | 1 | 1,360 | 4 | 0.29% |
| A3 | 450 μm~ | 50 | 200 | 0 | 0.9 | 821 | 0 | 0.00% |
| A4 | 50~450 μm | 200 | 50 | 0 | 0.9 | 1,539 | 1 | 0.06% |
| A5 | 50~450 μm | 0 | 200 | 50 | 1 | 1,048 | 12 | 1.15% |

As is shown in Chart 1, in the sample A1 in which the damage thickness was 50 μm or more and 450 μm or less, the number of damaged parts in the wall part was 50, the number of damaged parts in the corner part was 200 and the number of damaged parts in the bottom part was 0, good results were obtained with the pinhole generation rate being 0.04% and the single crystal yield being 1 (100%).

However, in the sample A2 in which the damage thickness was 50 μm or more, the number of damaged parts in the wall part was 50, the number of damaged parts in the corner part was 200 and the number of damaged parts in the bottom part was 0, the pinhole generation rate increased to 0.29% and the single crystal yield was 1 (100%). In addition, in the sample A3 in which the damage thickness was 450 μm or more, the number of damaged parts in the wall part was 50, the number of damaged parts in the corner part was 200 and the number of damaged parts in the bottom part was 0, the pinhole generation rate was extremely good at 0% but the single crystal yield dropped to 0.9 (90%).

In addition, in the sample A4 in which the damage thickness was 50 μm or more and 450 μm of less, the number of damaged parts in the wall part was 200 and the number of damaged parts in the corner part was 50, a good pinhole generation rate of 0.06% was obtained but the single crystal yield decreased to 0.9 (90%).

In addition, in the sample A5 in which the damage thickness was 50 μm or more and 450 μm of less, the number of damaged parts in the wall part was 0, the number of damaged parts in the corner part was 200 and the number of damaged parts in the bottom part was 50, the pinhole generation rate was 1.15% and the single crystal yield was 1 (100%). Thus, it was observed that the pinhole generation rate rose significantly in the case where there was damage in the crucible bottom part.

What is claimed is:

1. A silica glass crucible for pulling up a silicon single crystal including a wall part, a corner part and a bottom part, comprising:
    an outer layer formed from an opaque silica glass layer which includes many bubbles; and
    an inner layer formed from a transparent silica glass layer which substantially does not include bubbles, wherein
    at least one part of an inner surface of the wall part and the corner part being an uneven surface formed with multiple damaged parts having a depth of 50 μm or more and 450 μm or less, and a region among the inner surface of the bottom part within a certain range from the center of the bottom part being a smooth surface which does is substantially not formed with damage.

2. The silica glass crucible as claimed in claim 1, wherein the region within a certain range from the center of the bottom part includes a projection plane of the silicon single crystal.

3. The silica glass crucible as claimed in claim 1, wherein the region within a certain range from the center of the bottom part includes a region within 50% of the diameter of the crucible from the center of the crucible bottom part.

4. The silica glass crucible as claimed in claim 1, wherein the number of damaged parts formed on the inner surface of the corner part is more than the number of damaged parts formed on an inner surface of the wall part.

5. The silica glass crucible as claimed in claim 1, wherein the vicinity of the top end of the wall part which does not contact with a silicon melt is a smooth surface not formed with damaged parts.

6. The silica glass crucible as claimed in claim 1, wherein the shape of the damaged parts is a dimple shape.

7. The silica glass crucible as claimed in claim 1, wherein the shape of the damaged parts is a long thin line shape.

8. The silica glass crucible as claimed in claim 1, wherein the number of damaged parts is equal to 100 or more and 500 or less.

9. A silica glass crucible for pulling up a silicon single crystal including a wall part, a corner part and a bottom part, comprising:
    an outer layer formed from an opaque silica glass layer which includes many bubbles; and
    an inner layer formed from a transparent silica glass layer which substantially does not include bubbles, wherein
    at least one part of an inner surface of the wall part and the corner part is rougher than an inner surface of the bottom part.

10. The silica glass crucible as claimed in claim 9, wherein the inner surface of the corner part is rougher than the inner surface of the wall part.

11. A method for manufacturing a silica glass crucible, comprising:
    forming a silica glass crucible by melting and vitrifying a silica powder; and
    forming damaged parts having a depth of 50 μm or more and 450 μm or less on at least one part of an inner surface of a wall part and a corner part of the silica glass crucible.

12. The method for manufacturing a silica glass crucible as claimed in claim 11, wherein the damaged parts are formed using a diamond pen.

* * * * *